US007521998B2

(12) United States Patent
Okayama

(10) Patent No.: US 7,521,998 B2
(45) Date of Patent: Apr. 21, 2009

(54) OPERATIONAL AMPLIFIER AND SCANNING ELECTRON MICROSCOPE USING THE SAME

(75) Inventor: Tsutomu Okayama, Hitachinaka (JP)

(73) Assignees: Hitachi High-Technologies Corporation, Tokyo (JP); Hitachi High-Tech Science Systems Corporation, Ibaraki (JP)

( * ) Notice: Subject to any disclaimer, the term of this patent is extended or adjusted under 35 U.S.C. 154(b) by 48 days.

(21) Appl. No.: 11/602,288

(22) Filed: Nov. 21, 2006

(65) Prior Publication Data

US 2007/0115056 A1    May 24, 2007

(30) Foreign Application Priority Data

Nov. 24, 2005  (JP) ............................. 2005-338011

(51) Int. Cl.
 *H03F 3/45*    (2006.01)
(52) U.S. Cl. ........................................ 330/257; 250/307
(58) Field of Classification Search ................. 330/252, 330/261; 250/307, 310–311
See application file for complete search history.

(56) References Cited

U.S. PATENT DOCUMENTS

| | | | | |
|---|---|---|---|---|
| 4,431,915 A | * | 2/1984 | Nakagawa et al. | ......... 250/310 |
| 4,983,832 A | * | 1/1991 | Sato | ............................ 250/310 |
| 7,026,614 B2 | * | 4/2006 | Saitoh | ........................ 250/307 |
| 7,053,371 B2 | * | 5/2006 | Ojima et al. | ................. 250/310 |
| 7,071,781 B2 | * | 7/2006 | Everton et al. | .............. 330/261 |
| 7,087,899 B2 | * | 8/2006 | Ezumi et al. | ................. 250/311 |

FOREIGN PATENT DOCUMENTS

JP    8-125474 A    5/1996

* cited by examiner

*Primary Examiner*—Robert Pascal
*Assistant Examiner*—Hieu P Nguyen
(74) *Attorney, Agent, or Firm*—McDermott Will & Emery LLP

(57) ABSTRACT

An operational amplifier and a scanning electron microscope which are capable of dealing with high voltage and large current, and which allow implementation of stable and precise amplification, the operational amplifier having a first-stage amplification unit including a differential pair, a base-grounded amplification circuit, and an active load, the base-grounded amplification circuit being cascode-connected to the differential pair a second-stage amplification unit including an inverter having an emitter follower circuit and a constant-current load circuit, and a third-stage amplification unit including a source follower circuit or an emitter follower circuit.

10 Claims, 4 Drawing Sheets

United States Patent US 7,521,998 B2

OPERATIONAL AMPLIFIER AND SCANNING ELECTRON MICROSCOPE USING THE SAME

BACKGROUND OF THE INVENTION

1. Field of the Invention

The present invention relates to an operational amplifier for amplifying a signal. More particularly, it relates to an operational amplifier used for a deflector in a scanning electron microscope.

2. Description of the Related Art

In an integrated operational amplifier, because of the limits to its manufacturing process and package technology, it is generally difficult to deal with a voltage exceeding ±20 V or a current exceeding a few 100 mA. Meanwhile, in an operational amplifier using discrete transistors, it has been difficult to obtain excellent offset-voltage drift characteristics, high voltage gain, and high slew rate. Also, trying to obtain the high voltage gain has made it difficult to secure stability at the time when a negative feedback is applied as the operational amplifier.

In a conventional example of power amplifiers illustrated in FIG. 2, an IC-implemented transistor pair whose withstand voltage is low is used as a first-stage differential pair. Moreover, voltage amplification is performed by a base-grounded circuit which is cascode-connected to this differential pair.

A differential amplifier, however, is used at a second stage. As a result, there has existed a drawback that recovery from supersaturation is slow. In addition, there has existed a drawback that a sufficient open voltage gain cannot be obtained due to a load effect on the first stage by the second-stage differential amplifier.

There has also been a necessity for implementing a unit for facilitating phase compensation at the expense of direct-current characteristics. Here, this unit facilitates the phase compensation by lowering the voltage gain through insertion of a resistor into emitters of the first-stage differential pair.

Also, the value of a capacitor for the phase compensation is a small value which can be influenced by even a parasite capacity of each portion in the individual components. Accordingly, there has also been a necessity for paying the most careful attention to implementation of this value. The above-described problems, however, cannot be solved by operational amplifiers described in JP-A-8-125474; Tutomu Okayama, "Introduction to Practical Analog Circuit Design and Analysis", the Nikkan Kougyo Shinnbunn, p 200, FIG. 6.24; Bob Widlar, "IC OP AMP BEATS FETS ON INPUT CURRENT", EEE, December 1969; and "History of OP Amplifier and Basic Knowledge of Circuit Technologies", CQ Publishing Corp., p 57, FIG. 3 to FIG. 5.

SUMMARY OF THE INVENTION

It is an object of the present invention to solve the above-described problems, and to provide an operational amplifier and a scanning electron microscope which are capable of dealing with high voltage and large current, and which allow implementation of stable and precise amplification.

In the present invention, in order to solve the above-described problems, there is provided an operational amplifier having a first-stage amplification unit including a differential-pair, a base-grounded amplification circuit, and an active load, the base-grounded amplification circuit being cascode-connected to the differential pair, a second-stage amplification unit including an inverter having an emitter follower circuit and a constant-current load circuit, and a third-stage amplification unit including a source follower circuit or an emitter follower circuit.

According to the present invention, it becomes possible to provide an operational amplifier which is capable of dealing with high voltage and large current, and whose direct-current characteristics are quite satisfactory.

Other objects, features and advantages of the invention will become apparent from the following description of the embodiments of the invention taken in conjunction with the accompanying drawings.

DESCRIPTION OF THE INVENTION

Embodiment 1

Figure 1:
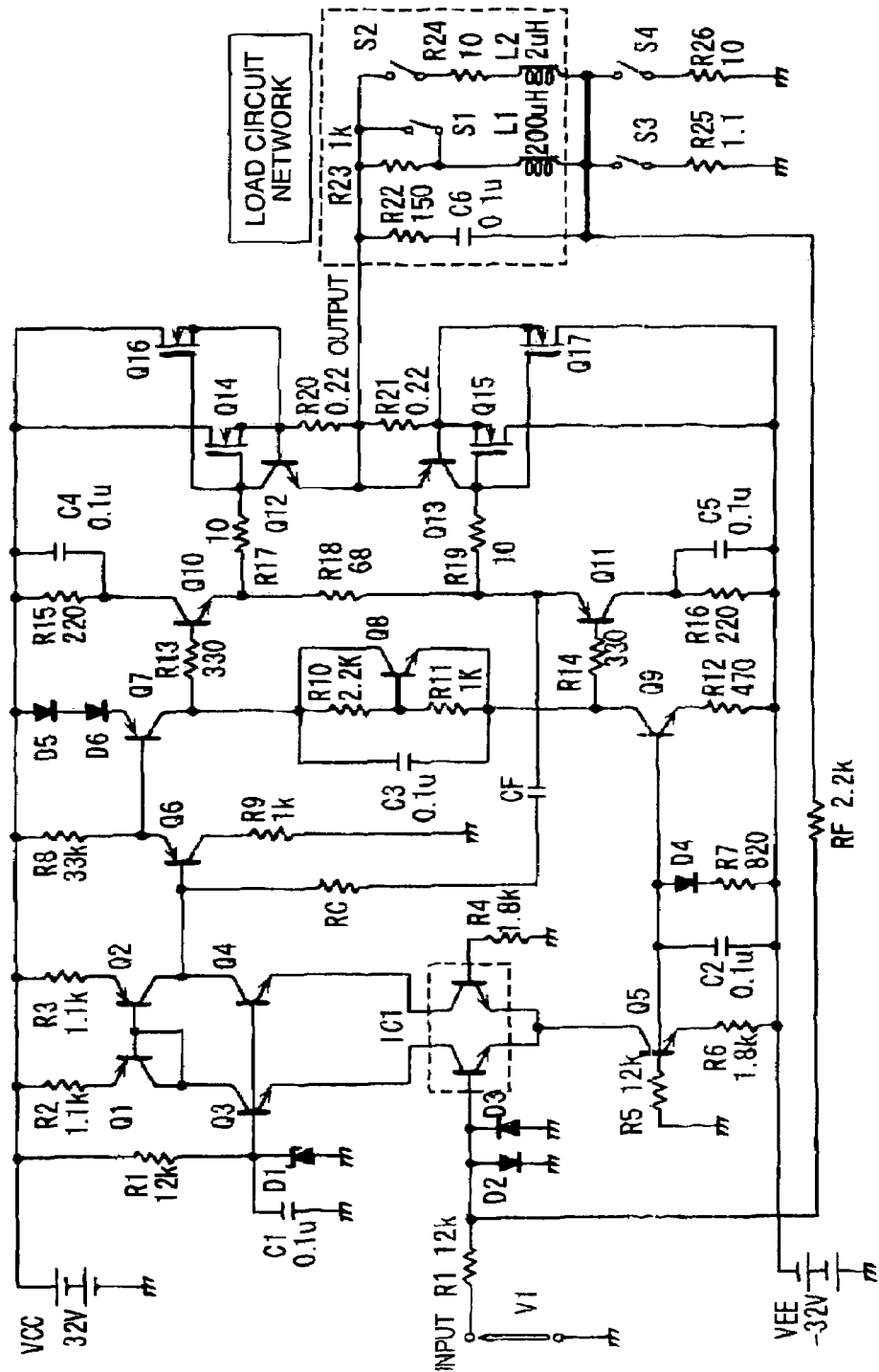
FIG. 1 is a diagram for explaining an embodiment of the present invention.
Figure 2:
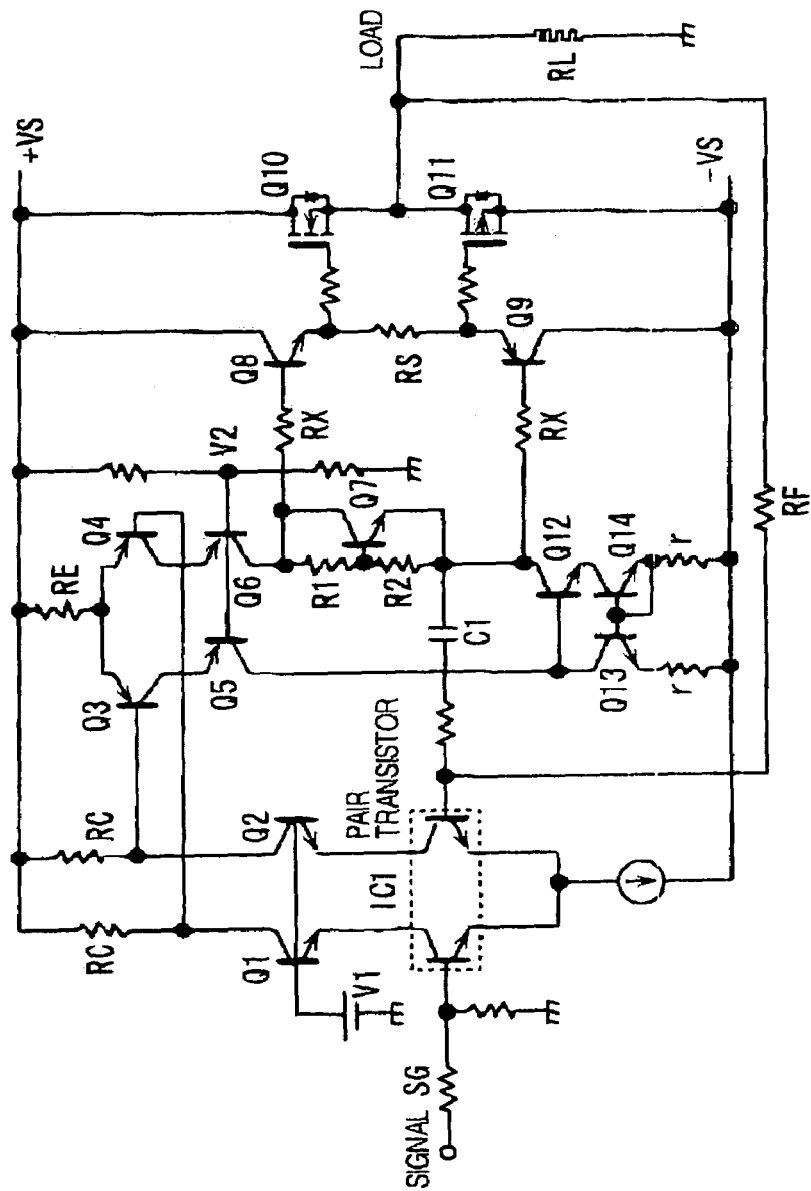
FIG. 2 is the diagram for explaining the example of the conventional amplification circuit.

FIG. 1 is an embodiment of the present invention. The voltage at a bias-voltage generation circuit including R5, D4, and R7 is selected as the reference, and a current sink circuit is configured using Q5. This current sink circuit absorbs an about 2-mA current in the constants set in FIG. 1. The addition of D4 substantially cancels out the temperature coefficient of an inter-base-emitter voltage VBE of Q5 and the temperature coefficient of D4 with each other, thereby making the circuit a current sink which is also stable to the temperature. The voltage applied to R6 is made equal to about 2V, i.e., a voltage value is employed which is a few times or a few tens of times larger than the case of a constant current source in monolithic integrated circuits. This voltage value corresponds to a constant's setting which allows acquisition of satisfactory characteristics in the individual components.

Here, although the circuit constants set in FIG. 1 require a satisfactory operational amplifier for implementation of direct-current offset voltage characteristics, the circuit constants are constant examples in a case where signal-source impedance is low. This makes it possible to implement a reduction in the bias current by trade-off with high-frequency wave characteristics at the first stage.

A reference numeral IC1 denotes a differential pair. In FIG. 1, a transistor pair is used as the differential pair IC1, and each of the transistors operates with an about 1-mA comparatively large collector current. If satisfactory temperature characteristics are unnecessary for the differential pair, simply establishing a thermal connection among the individual transistors is effective enough.

A base-grounded circuit of Q3 and Q4 to whose bases a constant voltage is applied by R1, D1, and C1 is cascode-connected to the differential pair IC1. This base-grounded circuit implements a configuration of suppressing a variation in the collector voltage of each transistor of the differential pair IC1, and preventing an inter-collector-base capacity Cob of each transistor of IC1 from making a contribution as a mirror capacity. This configuration enlarges the operation-capable frequency band of IC1. The influences of Cob can be reduced by increasing the collector current of each transistor of IC1.

Incidentally, C1 connects a 0.1-μF large capacity, which cannot be implemented by the monolithic integrated circuits, to the Zener diode D1 so that bases of the base-grounded transistors will exhibit low impedances even in the case of the high-frequency wave. This configuration maintains the collector voltage of each transistor of IC1 at a low constant voltage. As a result, it becomes possible to use the integrated transistor pair IC1 whose withstand voltage is low, and to reduce a thermal feedback which accompanies the change in the collector current. A resistor may be used instead of D1. Q3 and Q4 is the base-grounded circuit whose current amplification ratio is equal to about 1, and the load imposed on Q3 and Q4 is a Widlar-type current mirror circuit including Q1, Q2, R2, and R3. Here, this current mirror circuit is configured to insert the ballast resistors R2 and R3 therein so that the high withstand-voltage single-body transistors whose characteristics are not identical to each other can be used, and so that the symmetry can be maintained even when the pair property between Q1 and Q2 is not satisfactory. In the constants in FIG. 1, an about 1-V voltage drop is set to the ballast resistors. Since the deviation of the inter-base-emitter voltage VBE of the individual components is of an order of few tens of mV, setting a 0.3-V voltage drop at the ballast resistors is effective enough. Setting a 0.5-V voltage drop further enlarges the tolerable range.

According to the configuration of this first stage, it becomes possible to obtain a high voltage gain which is a few thousands of times larger even if the load effect at the next stage is taken into consideration. Consequently, this configuration is highly unlikely to be influenced by circuits of the second stage or thereinafter, thereby making it possible to implement the satisfactory offset voltage characteristics.

The second stage is an inverter configuration including an emitter follower circuit Q6, R8, and R9, and an emitter follower circuit Q7 and R10. The load on the inverter is a constant-current load circuit including Q9 and R12. At this stage, a bias circuit C3, R10, R11, and Q8 of a push-pull stage is inserted between the Q7 collector and the Q9 collector.

The bias circuit, which is an n-fold amplification diode circuit, is capable of setting the bias-voltage value arbitrarily. In FIG. 1, the bias-voltage value is set at 3.2 VBE. If a suitable bias voltage is an integer multiple of the joint voltage, this part can be replaced by a diode.

Diodes D5 and D6 are inserted into an emitter of the inverter Q7. In spite of the constant-current load, this insertion makes it possible to set the effective voltage gain of the inverter unit at a value which is a few hundreds of times larger.

Simultaneously, this insertion allows implementation of the operation at the Q4-collector voltage at which the Q7-collector current and the Q9-collector current become equal to each other. By inserting the two diodes into the emitter, it becomes possible to operate the Q2-collecter voltage at a voltage value ranging from VCC to about 4 VJ (VJ denotes the joint voltage). If it were not for D5 and D6, Q2 would operate at a low voltage, and the execution Cob would become larger. Accordingly, the number of the diodes is selected by taking the trade-off with the dynamic range into consideration.

This configuration allows the Q7-collector voltage to be changed by a small change in the Q6-base voltage. Consequently, it becomes possible to accomplish a high voltage time change ratio (i.e., slew rate) of the Q7 collector. Although C3 is loaded in parallel in order to improve the constant-voltage property for the high-frequency wave, the operation is also executable without C3. The existence of C3 makes it possible to fasten recovery from the supersaturation state.

Incidentally, replacing D5 and D6 by resistors decreases the positive-side dynamic range at an over-input time. R9 is inserted in order to restrict a variation in the Q7-emitter voltage in an area where Q7 is operating as a diode at the over-input time.

In the above-described constant-current load circuit, a constant current is generated at the emitter follower Q9 by using the voltage generated at R5, D4, and R7. Moreover, the collector side of Q9 is used as a current sink. The configuration of the constant-current load circuit is the same as that of the constant-current circuit used as the differential pair at the first stage. The constant-current load circuit, however, causes a current to flow which is about four times in amount. This allows an enhancement in the driving capability for the push-pull stage.

The emitter follower circuit Q6, R8, and R9 biases the Q7 base appropriately, and suppresses the load effect imposed on the first stage, thereby ensuring the high voltage gain at the first stage. In this way, the first-stage voltage gain in the present embodiment is tremendously high. Accordingly, in order to permit the first stage to exhibit its features, it is preferable that the first stage be buffered by the emitter follower circuits at the next stage. Incidentally, R9, which is a protection resistor at the time when Q7 fails, is not essential for the operation. Also, the connection point of R9 may be the 0-V line or the VEE power-source. In FIG. 1, the base current of Q6 is caused to flow so that base-current loads of Q1 and Q2 with respect to Q3 are canceled out. As a consequence, it becomes possible to obtain the satisfactory offset voltage characteristics.

The configuration of the first stage and the inverter stage makes it possible to obtain the high voltage gain. Simultaneously, this configuration allows implementation of a stable inversion operation by absorbing the voltage difference, which is caused by the ballast resistors of first-stage active loads using the individual components.

The push-pull stage configures a push-pull circuit R13, Q10, P14, Q11, and R18 including the bipolar transistors. The push-pull circuit drives a source follower circuit Q14, Q15, Q16, and Q17 including the power FETs with a low impedance. R18 and R20 are the stabilization resistors for the power FETs. Since, here, the large power is dealt with, the drawing is given such that the device-parallel connection is established for the two individual power FETs.

The use of power-oriented bipolar transistors, if its stable operation area is large enough, also allows implementation of basically the same effects as in the case where the power FETs are used. In FIG. 1, the power FETs whose stable operation area is large enough are used so that the power FETs will be able to withstand the severe output conditions.

Furthermore, when no large current is dealt with and only the high voltage is dealt with, the push-pull bias circuit constant is modified. This modification permits the power FET portion to be omitted with the push-pull stage left alone.

The resistors R13 and R14 are inserted in order to restrict a transient current at the push-pull stage. However, when no steep input change is assumed, or when a lowering in output capability at that time is tolerated, the resistors can be omitted. The case with no resistors inserted requires an additional recovery time from the supersaturation state.

R20, Q12, R21, and Q13 configures an output short-circuit protection circuit for the operational amplifier. If the output current becomes an overcurrent and if the voltage applied to R20 has exceeded about 0.6 V, this protection circuit lowers absolute values of the gate voltages of the FETs, thereby restricting the output current into a certain constant value. Since the high-speed driving for the FETs requires a large instantaneous current, the push-pull circuit including the bipolar transistors is designed as the low-impedance circuit. In order to operate the current restriction mechanism effectively, however, R15 and C4 and R16 and C5 maintain the low impedance for the high-frequency wave, and lower the impedance value for a low frequency. As a result of this, the consumption current by Q12 and Q13, which accompanies the current restriction on the FETs, is suppressed into a reasonable and satisfying value.

The configuration of the operational amplifier has been explained so far. Moreover, in this embodiment, the illustration also includes a feedback circuit for exerting a high-speed constant-current control over an inductance load circuit network. When S1 is ON, L1 is connected to the load. In the high-speed driving constant-current circuit for a heavy inductance load, a damper circuit including R22 and C6 is required for stability of the system in order to avoid occurrence of an overvoltage at the time when the current is changed at the high speed. This damper circuit suppresses an oscillation which occurs when a parasite capacity on the output line is inserted in parallel to L1. Also, this damper circuit shares a role of the phase compensation for the operational amplifier's main unit. Consequently, performing a suitable constant setting makes it possible to decrease the phase compensation capacity CF of the operational amplifier, thus allowing accomplishment of the high voltage time change ratio (i.e., slew rate) by a synergistic effect with the high-speed property of the circuit scheme described above.

Assume that S1 is turned OFF, and that S2 is turned ON. As a result of this, a current which will actually flow in the load L1 can be made smaller than the entire current while maintaining the impedance ratio at a constant value at an arbitrary frequency. In the constants in FIG. 1, the diversion ratio of 1:100 is set. Moreover, a wide current range from 1:1 to 1:1000 is made drivable by switching the current detection resistance.

When performing the high-speed driving in a wide current range, depending on the requirements, the value of the phase compensation capacity CF is switched for each range. In some cases, depending on the usage, value of phase-compensation-oriented RC becomes a small value which includes zero.

In FIG. 1, the feedback loop is used as the inversion amplifier. This feature maintains the voltages at current addition points (i.e., connection points of RI and RF) and R4 at substantially 0 V, thereby suppressing the same-phase voltages restricted by the Q3-emitter voltage and the Q4-emitter voltage. Of course, in the case of a voltage lower than the voltage at D1, it is also possible to configure the entire system in accordance with a positive-phase amplifier scheme.

Because the high voltage is dealt with, there exists an instance when a virtual short-circuit is not transiently established as the operational amplifier. On account of this, D1 and D2 protect IC1 so that an overvoltage will not be applied to IC1. In the case of the constants which lead to no application of the overvoltage, D1 and D2 can be omitted.

Figure 4:
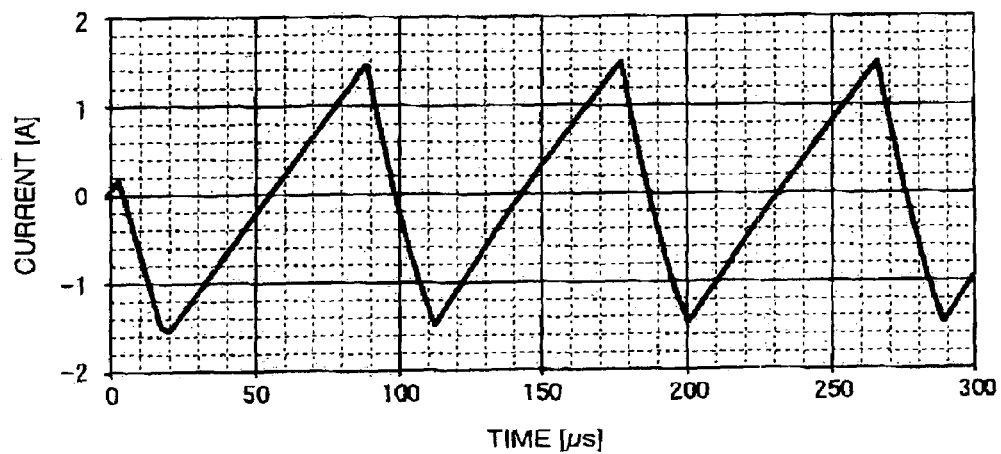
FIG. 4 is a diagram for explaining an example of current waveform of inductance load driving.

FIG. 4 illustrates an example of current waveform of the high-speed driving constant-current circuit for an inductance load according to the present embodiment. The constant-current control is exerted over the right-upward straight-line portions. The constant-current control over a 200-μH load has been beautifully accomplished.

Figure 5:
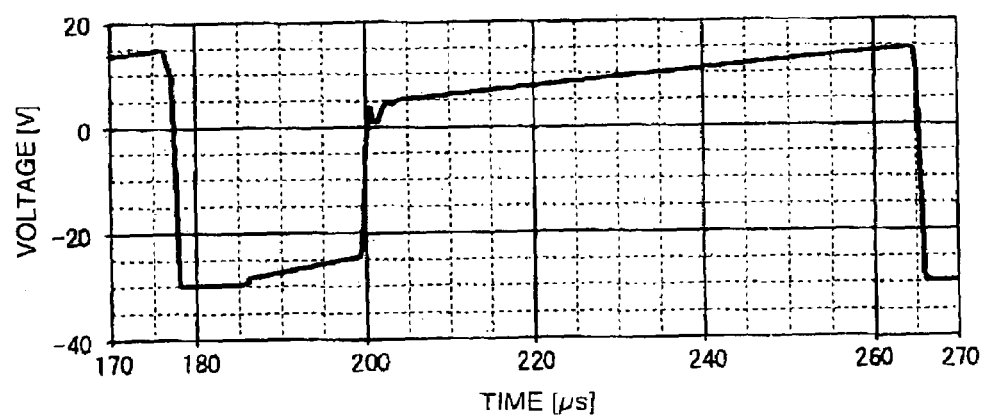
FIG. 5 is a diagram for explaining an example of voltage waveform of the inductance load driving.

FIG. 5 illustrates the voltage waveform with the same timing. Checking FIG. 5 shows that the circuit is operating at an about 100-V/μs high slew rate in spite of dealing with the peak power of 60 W or more. Checking FIG. 5 further shows that the recovery after the maximum voltage is outputted is quick enough.

Figure 3:
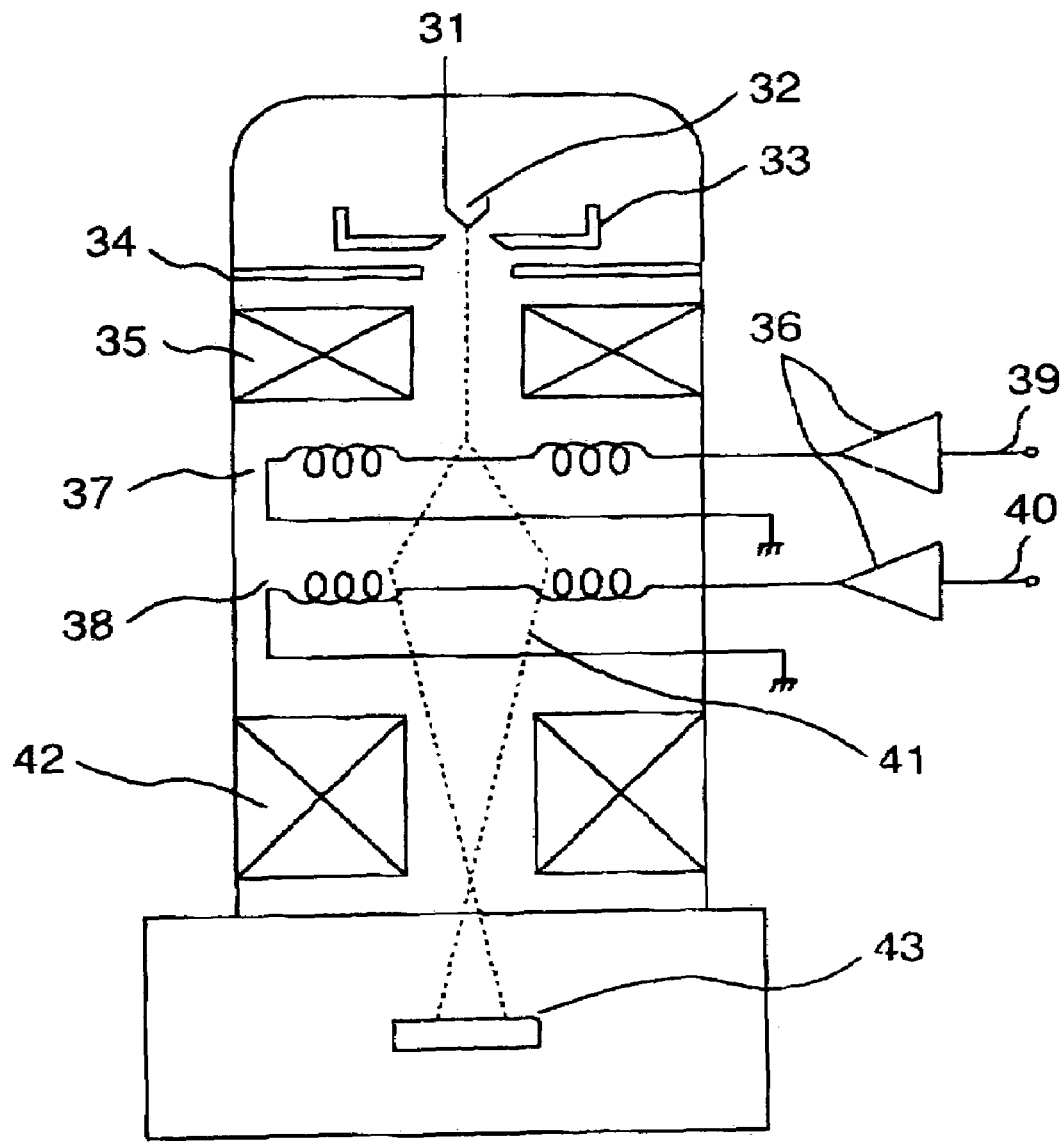
FIG. 3 is a diagram for explaining a schematic view of the scanning electron microscope.

The use of the high-speed and large-power precise operational amplifier as described above allows implementation of the following deflection system: Namely, for example, this deflection system executes a high-speed scanning and a low-speed scanning by using one and the same amplifier, while maintaining screen accuracy in a scanning electron microscope whose schematic diagram is presented in FIG. 3. Here, the basic operation of the scanning electron microscope in FIG. 3 is as follows: First, an electron bear 41 is emitted from a filament 32, i.e., a hot-cathode electron source to which a high voltage 31 is applied. Moreover, the electron beam 41 emitted is converged by a condenser lens 35, and is deflected by a higher-side deflection coil 37 and a lower-side deflection coil 38, then being scanned on the surface or a sample 43 via an objective lens 42. At this time, a H-side driving signal 39 and a L-side driving signal 40, which are to be supplied to the deflection coils 37 and 38 respectively, are amplified using a deflection-coil driving amplifier 36, i.e., the operational amplifier according to the present embodiment. Finally, a secondary-electron beam (not illustrated) emitted from the sample 43 is detected using a detector (not illustrated).

Also, it is possible to control the current ratio between the higher-side deflection coil 37 and the lower-side deflection coil 38 with a higher accuracy in a dynamical manner as well. Accordingly, it becomes possible to control the orbit of the electron beam 41 so that the electron beam 41 is certain to travel on the axis of the objective lens 42 on which there exists a less aberration. In particular, in a scanning electron microscope having a length-measuring function, there also exists an effect of reducing various types of corrections by software. In the explanation so far, the explanation has been given assuming that the unit for resistance values of the circuit constants is Ω, and the unit for capacity values is F.

According to the present invention, it becomes possible to configure the precise operational amplifier which is capable of dealing with the large power. Also, since there exist the circuit constants which permit acquisition of the high slew rate, it becomes possible to exert the constant-current control overran inductance load with a high accuracy, at a high speed, and in a precise manner. This feature allows implementation of enhancements in accuracy of such systems as precise measurement systems, sensor systems, and the deflection system in the scanning electron microscope.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope, comprising:
   an electron source,
   a deflector for deflecting an electron beam emitted from said electron source, and
   an amplifier for amplifying a signal to be supplied to said deflector,
   said amplifier, comprising:
   a first-stage amplification unit including a differential pair, a base-grounded amplification circuit which is cascode-connected to said differential pair and an active load connected to the base-grounded amplification circuit, and a second-stage amplification unit connected to said first-stage amplification unit, and including an emitter follower and a constant-current load circuit for said emitter follower, wherein said active load comprises a Widlar-type current mirror circuit having a ballast resistor.

2. The scanning electron microscope according to claim 1, further comprising:

a third-stage amplification unit including a source follower circuit or an emitter follower circuit.

3. The scanning electron microscope according to claim 1, wherein voltage applied to said ballast resistor is equal to 0.3 V or more.

4. The scanning electron microscope according to claim 2, wherein voltage applied to said ballast resistor is equal to 0.3 V or more.

5. A scanning electron microscope, comprising:

an electron source, a deflector for deflecting an electron beam emitted from said electron source, and an amplifier for amplifying a signal to be supplied to said deflector, said amplifier comprising:

a first-stage amplification unit including a differential pair and a base-grounded amplification circuit which is cascode-connected to said differential pair, and a second-stage amplification unit connected to said first-stage amplification unit, and including an emitter follower and a constant-current load circuit for said emitter follower, wherein said base-grounded amplification circuit of said first-stage amplification unit is connected to a capacitor.

6. The scanning electron microscope according to claim 5, further comprising:

a third-stage amplification unit including a source follower circuit or an emitter follower circuit.

7. The scanning electron microscope according to claim 5, wherein a diode or a resistor is connected to connection portion between said capacitor and said base-grounded amplification circuit of said first-stage amplification unit.

8. The scanning electron microscope according to claim 6, wherein a diode or a resistor is connected to connection portion between said capacitor and said base-grounded amplification circuit of said first-stage amplification unit.

9. A scanning electron microscope, comprising:

an electron source, a deflector for deflecting an electron beam emitted from said electron source, and an amplifier for amplifying a signal to be supplied to said deflector, said amplifier comprising:

a first-stage amplification unit including a differential pair and a base-grounded amplification circuit which is cascode-connected to said differential pair, and a second-stage amplification unit connected to said first-stage amplification unit, and including an inverter having an emitter follower and a constant-current load circuit for said emitter follower, wherein an emitter load of said inverter comprises a diode.

10. The scanning electron microscope according to claim 9, further comprising:

a third-stage amplification unit including a source follower circuit or an emitter follower circuit.

* * * * *